(12) United States Patent
Lin et al.

(10) Patent No.: US 9,997,399 B2
(45) Date of Patent: *Jun. 12, 2018

(54) METHOD FOR TRANSFERRING SEMICONDUCTOR STRUCTURE

(71) Applicant: MIKRO MESA TECHNOLOGY CO., LTD., Apia (WS)

(72) Inventors: Shih-Chyn Lin, Tainan (TW); Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/599,482

(22) Filed: May 19, 2017

(65) Prior Publication Data

US 2018/0053684 A1 Feb. 22, 2018

Related U.S. Application Data

(63) Continuation-in-part of application No. 15/238,706, filed on Aug. 16, 2016, now Pat. No. 9,722,134.

(51) Int. Cl.
| | |
|---|---|
| *H01L 21/00* | (2006.01) |
| *H01L 21/768* | (2006.01) |
| *H01L 21/30* | (2006.01) |
| *H01L 21/02* | (2006.01) |

(52) U.S. Cl.
CPC ...... *H01L 21/768* (2013.01); *H01L 21/02068* (2013.01); *H01L 21/02104* (2013.01); *H01L 21/30* (2013.01); *H01L 2224/80006* (2013.01)

(58) Field of Classification Search
CPC ......... H01L 33/00; H01L 21/68; H01L 51/00; H01L 21/00; H01L 33/62

USPC ......... 438/26, 27, 46, 34, 455, 464; 257/40, 257/100, E21.499

See application file for complete search history.

(56) References Cited

U.S. PATENT DOCUMENTS

| | | |
|---|---|---|
| 7,163,597 B2 | 1/2007 | Murata et al. |
| 8,333,860 B1 | 12/2012 | Bibl et al. |
| 8,518,204 B2 | 8/2013 | Hu |
| 8,558,243 B2 | 10/2013 | Bibl et al. |

(Continued)

FOREIGN PATENT DOCUMENTS

TW 201332140 A 8/2013

*Primary Examiner* — Sheikh Maruf
(74) *Attorney, Agent, or Firm* — CKC & Partners Co., Ltd.

(57) ABSTRACT

A method for transferring a semiconductor structure is provided. The method includes: coating an adhesive layer onto a carrier substrate; disposing the semiconductor structure onto the adhesive layer, in which the adhesive layer includes an adhesive component and an surfactant component after the disposing, the semiconductor structure includes a body and a bottom electrode, and the bottom electrode is disposed between the body and the adhesive layer after the disposing; irradiating a first electromagnetic wave to the adhesive layer to reduce adhesion pressure of the adhesive layer to the semiconductor structure while the semiconductor structure remains on the adhesive layer, in which the carrier substrate, the semiconductor structure, and the bottom electrode have a pass band in between ultraviolet to infrared; and transferring the semiconductor structure from the adhesive layer to a receiving substrate after the adhesion pressure of the adhesive layer is reduced.

20 Claims, 7 Drawing Sheets

(56) References Cited

U.S. PATENT DOCUMENTS

| | | |
|---|---|---|
| 8,794,501 B2 | 8/2014 | Bibl |
| 8,809,875 B2 | 8/2014 | Bibl |
| 2004/0168764 A1* | 9/2004 | Anker ............... H01L 21/67092 156/706 |
| 2006/0279679 A1* | 12/2006 | Fujisawa ............. G02B 5/0221 349/116 |
| 2007/0000595 A1* | 1/2007 | Prack .................... B24B 37/30 156/154 |
| 2007/0032089 A1* | 2/2007 | Nuzzo .................. B82Y 10/00 438/725 |
| 2007/0037364 A1 | 2/2007 | Sugita et al. |
| 2007/0089857 A1* | 4/2007 | Chiang ............... B01J 19/0046 165/80.2 |
| 2008/0108171 A1* | 5/2008 | Rogers ................ B81C 1/0046 438/73 |
| 2008/0122119 A1 | 5/2008 | Kian et al. |
| 2009/0199960 A1* | 8/2009 | Nuzzo .................... B82Y 10/00 156/230 |
| 2010/0176705 A1* | 7/2010 | Van Herpen ...... B32B 17/10036 313/46 |
| 2010/0252840 A1* | 10/2010 | Ibbetson ............. H01L 25/0753 257/88 |
| 2010/0283069 A1* | 11/2010 | Rogers ............... H01L 31/0725 257/98 |
| 2010/0317132 A1* | 12/2010 | Rogers ............... H01L 25/0753 438/27 |
| 2014/0084240 A1 | 3/2014 | Hu |
| 2015/0140729 A1* | 5/2015 | Ferro .................... G03F 7/2022 438/99 |
| 2015/0165743 A1* | 6/2015 | Horigome ............... B32B 27/08 156/249 |
| 2016/0072087 A1* | 3/2016 | Ferro .................... G03F 7/2022 257/40 |
| 2016/0144608 A1* | 5/2016 | Chang .................... B32B 37/12 216/83 |

* cited by examiner

METHOD FOR TRANSFERRING SEMICONDUCTOR STRUCTURE

RELATED APPLICATIONS

This application is a Continuation-in-part of U.S. application Ser. No. 15/238,706, filed on Aug. 16, 2016, and the entirety of which is incorporated by reference herein.

BACKGROUND

Technical Field

The present disclosure relates to a method for transferring at least one semiconductor structure between a growth substrate and a receiving substrate.

Description of Related Art

Electronics packaging technologies is toward further scaling down. The micro-device packaging becomes an important field today and improvements are always desired in any art.

SUMMARY

Traditional technologies for transferring of devices include transfer by wafer bonding from a transfer wafer to a receiving wafer. One such implementation is "direct transfer" involving one bonding step of an array of devices from a transfer wafer to a receiving wafer, followed by removal of the transfer wafer. Another such implementation is "indirect transfer" involving at least two bonding/de-bonding steps. In indirect transfer, a transfer head may pick up an array of devices from a donor substrate, and then bond the array of devices to a receiving substrate, followed by removal of the transfer head.

According to some embodiments of the present disclosure, a method for transferring at least one semiconductor structure is provided. The method includes: coating an adhesive layer onto a carrier substrate; disposing the semiconductor structure onto the adhesive layer, such that the adhesive layer temporarily adheres the semiconductor structure thereto, in which the adhesive layer includes at least one adhesive component and at least one surfactant component at least after the disposing, the semiconductor structure includes a body and a bottom electrode, and the bottom electrode is disposed between the body and the adhesive layer after the disposing; irradiating at least one first electromagnetic wave to the adhesive layer to reduce adhesion pressure of the adhesive layer to the semiconductor structure while the semiconductor structure remains within a predictable position on the adhesive layer, in which at least one of the carrier substrate and a combination of the body and the bottom electrode has a pass band in between ultraviolet to infrared; and transferring the semiconductor structure from the adhesive layer to a receiving substrate after the adhesion pressure of the adhesive layer is reduced.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
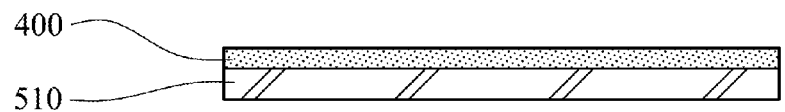
FIGS. 1 to 4 and 6 to 9 are schematic cross-sectional views of intermediate steps in a method for transferring at least one semiconductor structure according to one embodiment of this disclosure.

FIGS. 1 to 4 and 6 to 9 are schematic cross-sectional views of intermediate steps in a method for transferring at least one semiconductor structure 400 according to some embodiments of this disclosure. As shown in FIG. 1, a semiconductor structure 400 is formed on a growth substrate 510. The semiconductor structure 400 is an unchipped semiconductor structure.

Figure 2:
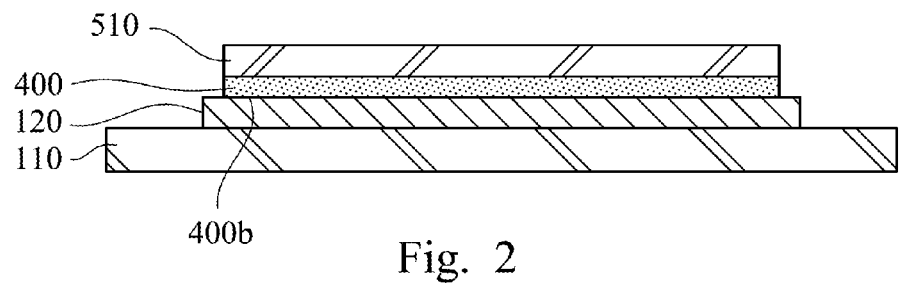

Then, as shown in FIG. 2, an adhesive layer 120 is coated onto a carrier substrate 110, and the semiconductor structure 400 with the growth substrate 510 contacts with the adhesive layer 120, such that the adhesive layer 120 temporarily adheres the semiconductor structure 400 thereto.

In some embodiments, the carrier substrate 110 may be made of glass, polycarbonate (PC), transparent plastic, fused silica, sapphire or transparent ceramic, the like, or any combination thereof.

Specifically, the adhesive layer 120 includes at least one adhesive component and at least one surfactant component therein at least after the semiconductor structures 400 are disposed onto the adhesive layer 120. In some embodiments, the surfactant component is mixed with the adhesive component before the adhesive layer 120 is coated onto the carrier substrate 110. Embodiments of this disclosure are not limited thereto. Other embodiments to add the surfactant component to adhesive layer 120 will be discussed later.

The adhesive component is made of adhesion capable organic. More specifically, the adhesive component is made of epoxy, polymethylmethacrylate (PMMA), polysiloxanes, silicone, the like, or any combination thereof.

In some embodiments, the surfactant component includes, for example, at least one fluorosurfactant component, or, for example, at least one silicone surfactant component, or, for example, at least one hydrocarbon surfactant component, or the like. Specifically, the surface composition of the fluorosurfactant component includes function group, for example, $-CF_3$ or $-CF_2CF_2-$; the surface composition of the hydrocarbon surfactant component includes, for example, $-CH_3$ or $-CH_2CH_2-$; and the surface composition of the silicone surfactant component includes, for example, $-(Si(CH_3)_2O)_n-$.

The adhesive layer 120 has a thickness in a range from about 0.5 μm to about 100 μm. Adhesion pressure of the adhesive layer 120 to the semiconductor structure 400 is in a range from about 0 atm to about $1\times10^3$ atm. The adhesive layer 120 is coated by a spin coater, a slit coater, the like, or any combination thereof.

Figure 3:
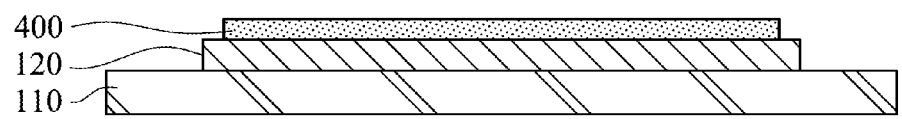

As shown in FIGS. 2 and 3, the growth substrate 510 is removed from the semiconductor structure 400 temporarily adhered to the adhesive layer 120. Specifically, the removing is performed by laser lift-off, chemical lift-off, mechanical lift-off, or any combination thereof. Embodiments of this disclosure are not limited thereto. The removing may be performed by other methods as well.

Figure 4:
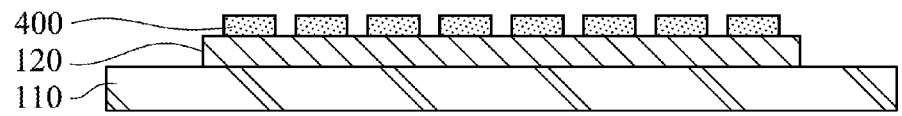

As shown in FIG. 4, the semiconductor structure 400 is chipped to form chipped semiconductor structures 400. The chipping may be performed by chemical dry etching, wet etching, laser, mechanical chipping, or other methods. The chipping may be performed by inductively coupled plasma (ICP), wet etching, or other methods.

Specifically, the chipped semiconductor structures 400 are light emitting diodes (LEDs). More specifically, the chipped semiconductor structures 400 are thin LEDs. The thickness of each of the chipped semiconductor structures 400 may be in a range from about 0.5 μm to about 100 μm. The chipped semiconductor structures 400 may be vertical type LEDs. The cross section area of each of the chipped semiconductor structures 400 may be in a range from about 0.25 μm² to about 1 mm².

Figure 5:
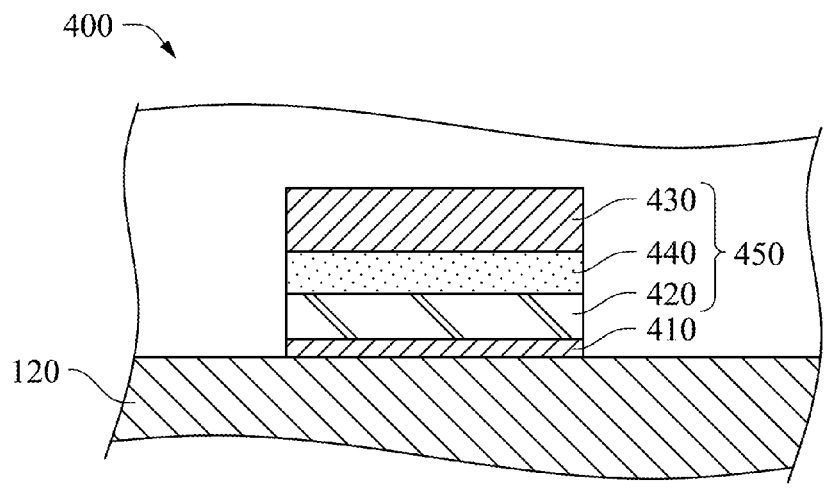
FIG. 5 is a schematic enlarged cross-sectional view of the chipped semiconductor structure and an adhesive layer according to one embodiment of this disclosure.

FIG. 5 is a schematic enlarged cross-sectional view of the chipped semiconductor structure 400 and the adhesive layer 120 according to one embodiment of this disclosure. As shown in FIG. 5, the chipped semiconductor structure 400 includes a bottom electrode 410 and a body 450. The body 450 is disposed on the bottom electrode 410. The bottom electrode 410 is disposed between the body 450 and the adhesive layer 120 after the semiconductor structures 400 are disposed onto the adhesive layer 120. The body 450 includes a first semiconductor layer 420, a second semiconductor layer 430, and an active layer 440. The first semiconductor layer 420 is disposed on the bottom electrode 410. The active layer 440 is disposed on the first semiconductor layer 420. The second semiconductor layer 430 is disposed on the active layer 440. In other words, the active layer 440 is disposed between the first semiconductor layer 420 and the second semiconductor layer 430. The active layer 440 is configured to emit light. The second semiconductor layer 430 is configured to be disposed on and electrically connected to a top electrode.

Embodiments of this disclosure are not limited thereto. In some other embodiments, the semiconductor structure 400 may be chipped before the semiconductor structure 400 contacts with the adhesive layer 120.

Figure 6:
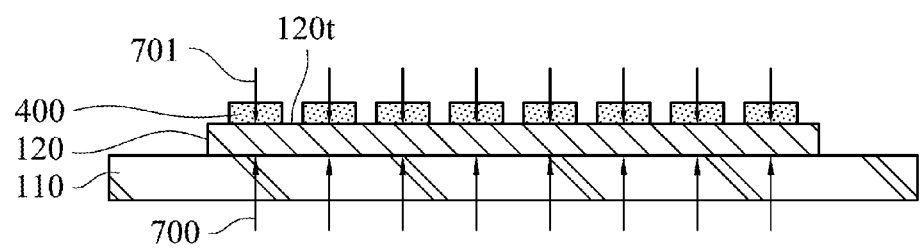

Then, as shown in FIG. 6, at least one of at least one electromagnetic wave 700 and at least one electromagnetic wave 701 irradiates the adhesive layer 120 to reduce the adhesion pressure of the adhesive layer 120 to each of the semiconductor structures 400 while remaining the semiconductor structures 400 respectively within predictable positions on the adhesive layer 120. Specifically, the reduced adhesion pressure of the adhesive layer 120 to each of the semiconductor structures 400 is times greater than the weight of each of the semiconductor structures 400, and the expansion or shrinking scale during the reducing adhesion pressure could be estimated so that the semiconductor structures 400 respectively remains within the predictable positions on the adhesive layer 120.

In some embodiments, only electromagnetic wave 700 irradiates the adhesive layer 120. In some embodiments, only electromagnetic wave 701 irradiates the adhesive layer 120. In some embodiments, electromagnetic wave 700 and electromagnetic wave 701 irradiates the adhesive layer 120.

At least one of the carrier substrate 110 and a combination of the body 450 and the bottom electrode 410 of each of the semiconductor structures 400 has a pass band in between ultraviolet to infrared.

In some embodiments, the pass band of the carrier substrate 110 and the spectrum of the electromagnetic wave 700 at least partially overlap.

In some embodiments, the pass band of the bottom electrode 410, the pass band of the body 450, and the spectrum of the electromagnetic wave 701 at least partially overlap.

In some embodiments, the pass band of the carrier substrate 110 and the spectrum of the electromagnetic wave 700 at least partially overlap, and the pass band of the bottom electrode 410, the pass band of the body 450, and the spectrum of the electromagnetic wave 701 at least partially overlap.

In some embodiments, the pass band of the carrier substrate 110 is in a range between about 150 nm to about 1800 nm. The pass band of the bottom electrode 410 is in a range between about 150 nm to about 1800 nm. The pass band of the body 450 is in a range between about 150 nm to about 1800 nm. The electromagnetic wave 700 has a spectrum in a range between about 150 nm to about 1800 nm. The electromagnetic wave 701 has a spectrum in a range between about 150 nm to about 1800 nm. Embodiments of this disclosure are not limited thereto. The person having ordinary skill in the art can make proper modifications to the carrier substrate 110, the bottom electrode 410, the body 450, the electromagnetic wave 700, and the electromagnetic wave 701 depending on the actual application.

Specifically, the electromagnetic wave 701 is irradiated from one side of the adhesive layer 120 opposite to the carrier substrate 110. The electromagnetic wave 700 is irradiated from one side of the adhesive layer 120 facing the carrier substrate 110.

Since the adhesive layer 120 can be irradiated from both sides of the adhesive layer 120 by the electromagnetic wave 700 and/or the electromagnetic wave 701, the electromagnetic wave 700 and/or the electromagnetic wave 701 can be chosen to irradiate the adhesive layer 120 according to the characteristics of the carrier substrate 110, the adhesive layer 120, the semiconductor structure 400, the bottom electrode 410, and the manufacturing apparatus.

When irradiating the electromagnetic wave 700 and/or the electromagnetic wave 701 to the adhesive layer 120, the adhesive component is cross-linked to form a network (cured), and thus the network may push the surfactant component toward the top surface 120t of the adhesive layer facing the semiconductor structures 400.

Specifically, the reduced adhesion pressure of the adhesive layer 120 to each of the semiconductor structures 400 is smaller than the adhesion pressure of the adhesive layer 120 to the carrier substrate 110, which means that the surface energy on the top surface 120t of the adhesive layer 120 facing the semiconductor structures 400 is smaller than the surface energy on a bottom surface of the adhesive layer 120 facing the carrier substrate 110. Therefore, when the adhesive component is cross-linked to become a network, the surfactant component is driven toward the top surface 120t of the adhesive layer 120 facing the semiconductor structure 400, rather than toward the bottom surface of the adhesive layer 120 facing the carrier substrate 110.

In some embodiments, the adhesion pressure of the adhesive layer 120 to each of the semiconductor structures 400 before the adhesion pressure of the adhesive layer 120 is reduced is about 1 atm and the reduced adhesion pressure of the adhesive layer 120 to each of the semiconductor structures 400 is below 0.1 atm.

The adhesive layer 120 has a Young's modulus less than or equal to about 30 GPa before and after the adhesion pressure of the adhesive layer 120 is reduced.

At least one process (for example, a laser lift-off process or a chipping process) is performed on the semiconductor structures 400 temporarily adhered to the adhesive layer 120 before the adhesion pressure of the adhesive layer 120 is reduced. Because of the adhesion pressure of the adhesive layer 120 to each of the semiconductor structures 400, the location of each of the semiconductor structures 400 remains within a predictable position on the adhesive layer 120 during the process, or the relative locations of the semiconductor structures 400 remain respectively within predictable positions on the adhesive layer 120 during the process. In addition, the adhesive layer 120 may function as a buffer layer to absorb external forces (for example, mechanical forces) because of its relative lower Yang's modules coefficient comparing to the chip (the semiconductor structures 400).

Figure 7:
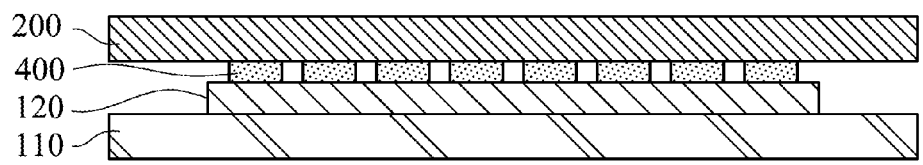

As shown in FIG. 7, a transfer head 200 is positioned over the semiconductor structures 400, and then the semiconductor structures 400 are contacted with the transfer head 200. The adhesive layer 120 deforms to absorb impact force of the transfer head 200 on the semiconductor structures 400 during the contacting.

Figure 8:
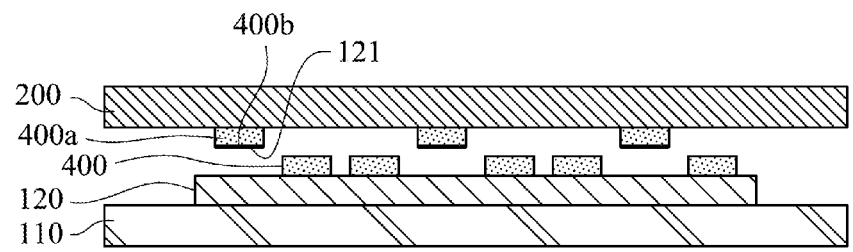

As shown in FIG. 8, the transfer head 200 is actuated to create grip force on a part of the semiconductor structures 400, i.e., the semiconductor structures 400a. Then, the semiconductor structures 400a are picked up with the transfer head 200 from the adhesive layer 120. In some embodiments, the semiconductor structures 400a are transferred to a receiving substrate structure. Embodiments of this disclosure are not limited thereto. In some other embodiments, the semiconductor structures 400a may be damaged devices, and the semiconductor structures 400a are picked up and then discarded.

Specifically, because the adhesive layer 120 includes the surfactant component, the adhesion pressure of the adhesive layer 120 to each of the semiconductor structures 400 can be further reduced after the electromagnetic wave 700 and/or the electromagnetic wave 701 are irradiated to the adhesive layer 120. Therefore, the semiconductor structures 400a are easier to be picked up with the transfer head 200 from the adhesive layer 120.

Figure 9:
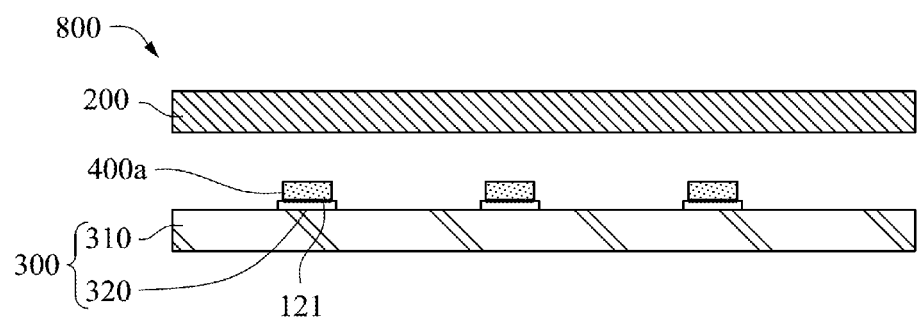

Then, as shown in FIG. 9, the semiconductor structures 400a are released onto a receiving substrate structure 300. Specifically, the semiconductor structures 400a are respectively released onto specific positions of the receiving substrate structure 300, i.e., conductive pads 320 present on a receiving substrate 310.

The grip force of the transfer head 200 is electrostatics force, vacuum force, adhesion pressure, mechanical force, magnetic force, the like, or any combination thereof.

In some embodiments, the receiving substrate structure 300 is an active component array substrate. Therefore, the receiving substrate structure 300 and the semiconductor structures 400a form a display panel. Embodiments of this disclosure are not limited thereto. In some other embodiments, the receiving substrate structure 300 and the semiconductor structures 400a may form a lighting device. In addition, the receiving substrate 300 may be a passive component array substrate as well.

In some embodiments, only the semiconductor structures 400a (a part of the semiconductor structures 400) are transferred to the receiving substrate structure 300. Embodiments of this disclosure are not limited thereto. In some other embodiments, all of the semiconductor structures 400 are transferred to the receiving substrate structure 300.

Because of the adhesion pressure and the buffer function of the adhesive layer 120, the location of each of the semiconductor structures 400 temporarily adhered to the adhesive layer 120 remains within a predictable position during processes, such that the transfer head 200 can be positioned easily over the semiconductor structures 400. In addition, the impact force of the transfer head 200 on the semiconductor structures 400 during the contacting is absorbed by the adhesive layer 120, such that the semiconductor structures 400 are not damaged by the transfer head 200. Therefore, the process yield is increased.

In addition, because the adhesive layer 120 includes the surfactant component, the adhesion pressure of the adhesive layer 120 to each of the semiconductor structures 400 can be further reduced after the electromagnetic wave 700 and/or the electromagnetic wave 701 are irradiated to the adhesive layer 120. Therefore, the semiconductor structures 400 are easier to be picked up with the transfer head 200 from the adhesive layer 120.

As shown in FIG. 9, in some embodiments, the semiconductor structures 400a transferred to the receiving substrate structure 300 are micro light-emitting diodes (LEDs), and thus the semiconductor structures 400a and the receiving substrate structure 300 form a micro LED structure 800. The micro LED structure 800 includes a receiving substrate 310, at least one conductive pad 320, at least one semiconductor structure 400a (i.e. at least one micro LED), and a residual material 121. The conductive pad 320 is present on the receiving substrate 310. The semiconductor structure 400a is present on the conductive pad 320. The residual material 121 is present between the conductive pad 320 and the semiconductor structure 400a. Specifically, the residual material 121 includes at least one surfactant component, which is the residual surfactant component in the adhesive layer 120.

Specifically, the surfactant component may diffuse from the residual material 121 to the conductive pad 320. The concentration of the surfactant component in the conductive pad 320 is the highest at a top surface of the conductive pad 320 facing the semiconductor structure 400a, and the concentration of the surfactant component in the conductive pad 320 decreases as the distance between the measured position and the top surface of the conductive pad 320 facing the semiconductor structure 400a become greater.

In some embodiments, the surfactant component includes, for example, at least one fluorosurfactant component, or, for example, at least one silicone surfactant component, or, for example, at least one hydrocarbon surfactant component, the like or any combination thereof. Specifically, the surface composition of the fluorosurfactant component includes, for example, —$CF_3$ or —$CF_2CF_2$—; the surface composition of the hydrocarbon surfactant component includes, for example, —$CH_3$ or —$CH_2CH_2$—; and the surface composition of the silicone surfactant component includes, for example, —$(Si(CH_3)_2O)_n$—.

The residual material 121 may further include residual adhesive, which is the residual photoreacted adhesive component in the adhesive layer 120.

As shown in FIG. 8, the residual material 121 is present on a bottom surface 400b of the semiconductor structure 400a. When the semiconductor structures 400a are transferred to the receiving substrate structure 300, the residual material 121 with the surfactant component therein can prevent small particles, dust, etc. from contaminating the bottom surface 400b of the semiconductor structure 400a.

Figure 10:
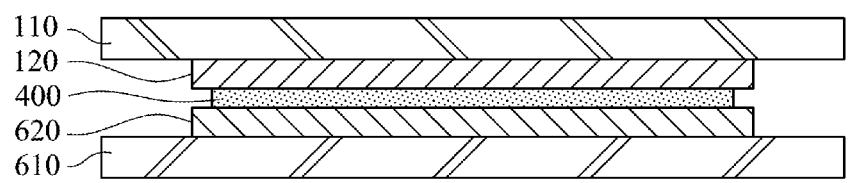
FIGS. 10 and 11 are schematic cross-sectional views of intermediate steps in the method for transferring the semiconductor structures according to another embodiment of this disclosure.
Figure 11:
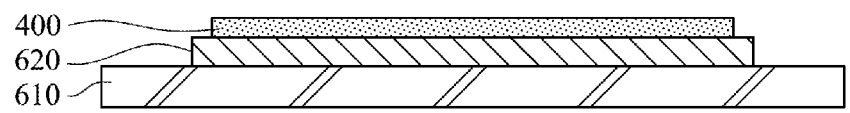

FIGS. 10 and 11 are schematic cross-sectional views of intermediate steps in the method for transferring the semiconductor structure 400 according to some embodiments of this disclosure. As shown in FIG. 3, if the semiconductor structure 400 temporarily adhered to the adhesive layer 120 should be turned upside down, additional operations are performed as shown below.

As shown in FIGS. 3 and 10, an adhesive layer 620 is coated onto a carrier substrate 610. Then, after the adhesion pressure of the adhesive layer 120 to the semiconductor structure 400 is reduced, the semiconductor structure 400 contacts the adhesive layer 620. The adhesive layers 120 and 620 deform to absorb impact forces of the adhesive layers 120 and 620 on the semiconductor structure 400 during the contacting.

Then, as shown in FIG. 11, because of the adhesion pressure of the adhesive layer 620 to the semiconductor structure 400, the adhesive layer 620 temporarily adheres the semiconductor structure 400 thereto, and the adhesive layer 120 with the carrier substrate 110 is removed. The following operations are similar to the aforementioned operations as shown in FIGS. 4 and 6 to 9.

Specifically, the reduced adhesion force of the adhesive layer 120 is greater than the weight of the semiconductor structure 400, such that the semiconductor structure 400 do not escape from the adhesive layer 120 when the adhesive layer 120 is turned upside down or during handling process.

Embodiments of this disclosure are not limited thereto. In other embodiments, before the adhesion pressure of the adhesive layer 120 to the semiconductor structure 400 is reduced, the semiconductor structure 400 contacts the adhesive layer 620. Then, the adhesion pressure of the adhesive layer 120 to the semiconductor structure 400 is reduced.

In some other embodiments, the operations performed in FIG. 10 and FIG. 11 are performed after the semiconductor structure 400 is chipped.

Figure 12:
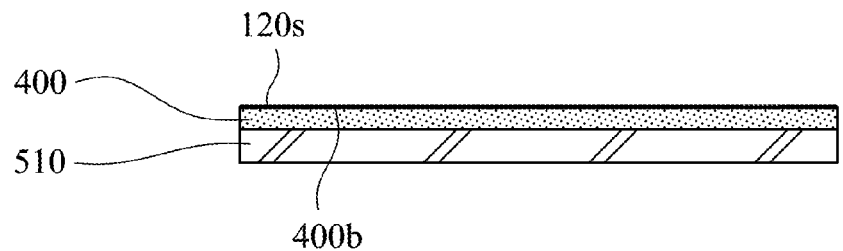
FIG. 12 is a schematic cross-sectional view of an intermediate step in the method for transferring the semiconductor structures according to another embodiment of this disclosure.

FIG. 12 is a schematic cross-sectional view of an intermediate step in the method for transferring the semiconductor structure 400 according to some embodiments of this disclosure. In some embodiments, the surfactant component may be added to the top surface of the adhesive layer 120 indirectly. As shown in FIG. 12, the surfactant component 120s is disposed onto the bottom surface 400b of the semiconductor structure 400 before the semiconductor structure 400 are disposed onto the adhesive layer 120. Then, as shown in FIG. 2, the bottom surface 400b of the semiconductor structure 400 is in contact with the adhesive layer 120 after the semiconductor structure 400 is disposed onto the adhesive layer 120. After the semiconductor structure 400 is disposed onto the adhesive layer 120, the surfactant component 120s is added to the top surface of the adhesive layer 120.

Figure 13:
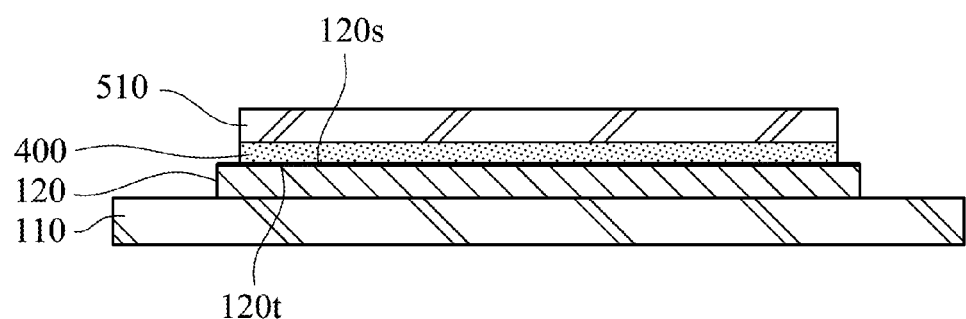
FIG. 13 is a schematic cross-sectional view of an intermediate step in the method for transferring the semiconductor structures according to another embodiment of this disclosure.

FIG. 13 is a schematic cross-sectional view of an intermediate step in the method for transferring the semiconductor structure 400 according to some embodiments of this disclosure. In some embodiments, the surfactant component may be added to the top surface of the adhesive layer 120 directly. As shown in FIG. 13, the surfactant component 120s is disposed onto the top surface 120t of the adhesive layer 120 before the semiconductor structure 400 are disposed onto the adhesive layer 120. That is, the surfactant component 120s is applied to the top surface 120t of the adhesive layer 120 directly before the semiconductor structure 400 are disposed onto the adhesive layer 120. The top surface 120t of the adhesive layer 120 is the surface that is in contact with the semiconductor structure 400 after the semiconductor structure 400 is disposed onto the adhesive layer.

In some embodiments, the adhesive layer 120 coated onto the carrier substrate 110 may have no surfactant component therein, and the surfactant component is added to the top surface of the adhesive layer 120 indirectly (as shown in FIG. 12), directly (as shown in FIG. 13), or both after the adhesive layer 120 is coated onto the carrier substrate 110. However, embodiments of this disclosure are not limited thereto. The aforementioned ways to add the surfactant component to the adhesive layer 120 may be combinable. For example, in some embodiments, the surfactant component and the adhesive component are mixed and coated onto the carrier substrate 110 to form the adhesive layer 120, and then a further surfactant component may be added to the top surface of the adhesive layer 120 indirectly (as shown in FIG. 12), directly (as shown in FIG. 13), or both.

Figure 14A:
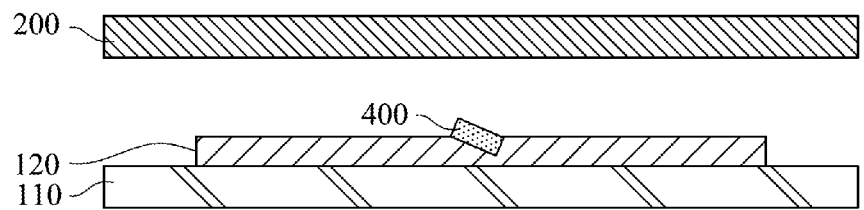
FIG. 14A is a schematic cross-sectional view of an intermediate step when a transfer head is about to contact the semiconductor structure in the method for transferring the semiconductor structure according to one embodiment of this disclosure.
Figure 14B:
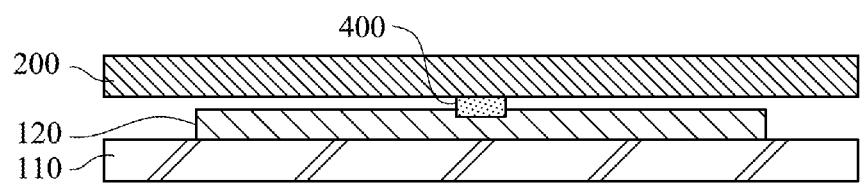
FIG. 14B is a schematic cross-sectional view of an intermediate step when the transfer head contacts the semiconductor structure in the method for transferring the semiconductor structure according to one embodiment of this disclosure.

The adhesive layer 120 has alignment function as well. FIG. 14A is a schematic cross-sectional view of an intermediate step when the transfer head 200 is about to contact the semiconductor structure 400 in the method for transferring the semiconductor structure 400 according to some embodiments of this disclosure. FIG. 14B is a schematic cross-sectional view of an intermediate step when the transfer head 200 contacts the semiconductor structure 400 in the method for transferring the semiconductor structure 400 according to some embodiments of this disclosure. As shown in FIG. 14A, the semiconductor structure 400 temporarily adhered to the adhesive layer 120 may not be level. As shown in FIG. 14B, when the transfer head 200 contacts the semiconductor structure 400, the adhesive layer 120 deforms and levels the semiconductor structure 400 with the transfer head 200, such that the semiconductor structure 400 is aligned with the transfer head 200 and the transfer head 200 can pick up the semiconductor structures 400 easily.

Figure 15A:
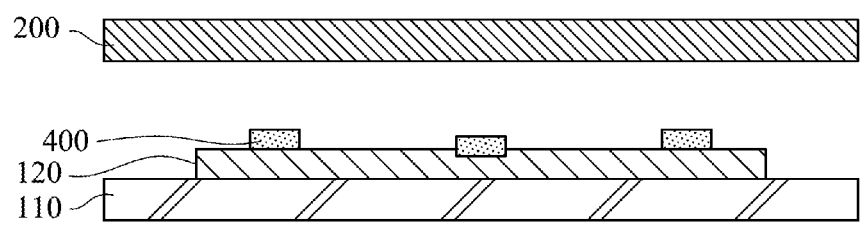
FIG. 15A is a schematic cross-sectional view of an intermediate step when the transfer head is about to contact the semiconductor structures in the method for transferring the semiconductor structures according to one embodiment of this disclosure.
Figure 15B:
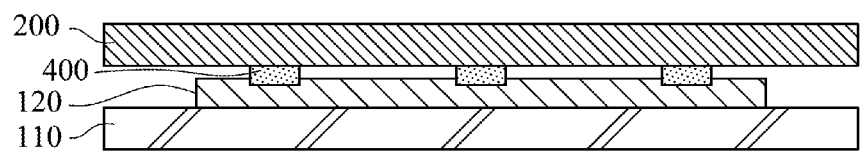
FIG. 15B is a schematic cross-sectional view of an intermediate step when the transfer head contacts the semiconductor structures in the method for transferring the semiconductor structures according to one embodiment of this disclosure.

FIG. 15A is a schematic cross-sectional view of an intermediate step when the transfer head 200 is about to contact the semiconductor structures 400 in the method for transferring the semiconductor structures 400 according to some embodiments of this disclosure. FIG. 15B is a schematic cross-sectional view of an intermediate step when the transfer head 200 contacts the semiconductor structures 400 in the method for transferring the semiconductor structures 400 according to some embodiments of this disclosure. As shown in FIG. 15A, different semiconductor structures 400 may not be disposed at the same height, such that a part of the semiconductor structures 400 disposed at a lower height may not be picked up by the transfer head 200 due to a gap between the part of the semiconductor structures 400 and the transfer head 200. As shown in FIG. 15B, when the transfer head 200 contacts the semiconductor structures 400, the adhesive layer 120 deforms and levels the semiconductor structures 400 with the transfer head 200 to eliminate the gap between the semiconductor structures 400 and the transfer head 200 to maintain the grip force of the transfer head 200, such that the semiconductor structures 400 are aligned with the transfer head 200 and the transfer head 200 is easy to pick up the semiconductor structures 400.

Figure 16A:
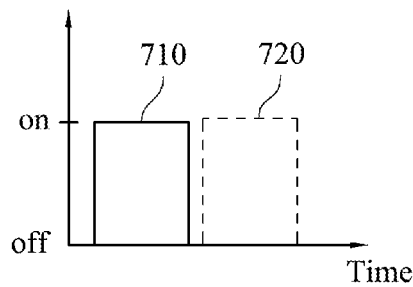
FIG. 16A to FIG. 16I are schematic time figure of time periods of irradiating the electromagnetic waves according to some embodiments of this disclosure.
Figure 16B:
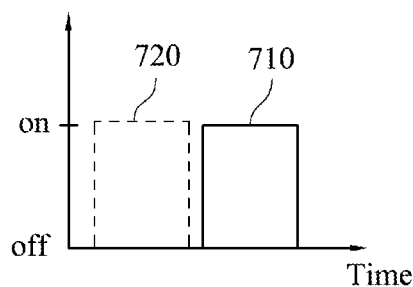
Figure 16C:
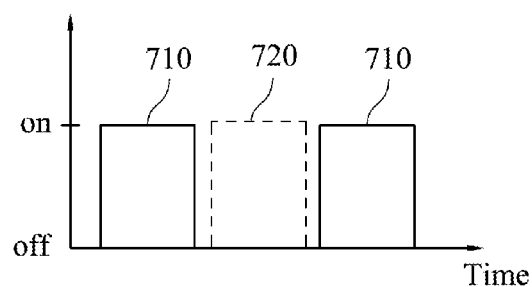

FIG. 16A to FIG. 16I are schematic time figure of time periods of irradiating the electromagnetic waves according to some embodiments of this disclosure. As shown in FIG. 6 and FIG. 16A to FIG. 16I, the time periods 710 represent the time periods of irradiating the electromagnetic wave 701, and the time periods 720 represent the time periods of irradiating the electromagnetic wave 700. In some embodiments, the time period 710 of irradiating the electromagnetic wave 701 and the time period 720 of irradiating the electromagnetic wave 700 do not overlap, for example, as shown in FIG. 16A to FIG. 16C. The electromagnetic wave 701 may irradiate first, for example, as shown in FIG. 16A. The electromagnetic wave 700 may irradiate first, for example, as shown in FIG. 16B. The electromagnetic waves 700 and 701 may alternately irradiate, for example, as shown in FIG. 16C. The electromagnetic waves 700 may irradiate once or more than once. The electromagnetic waves 701 may irradiate once or more than once. The number of irradiating the electromagnetic wave 700 and the number of irradiating the electromagnetic wave 701 may be the same or different.

Figure 16D:
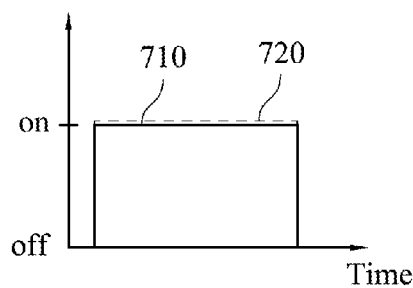
Figure 16E:
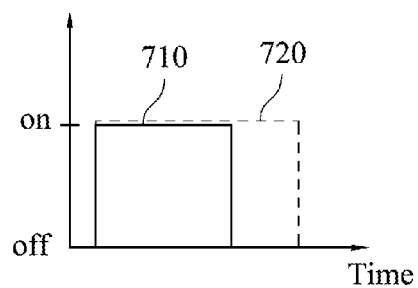
Figure 16F:
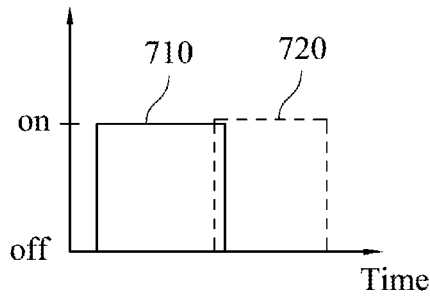
Figure 16G:
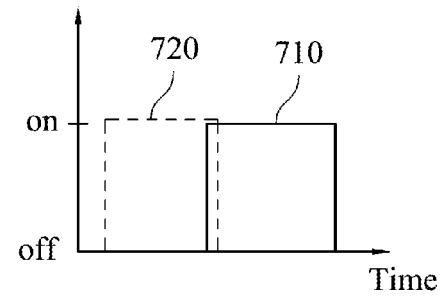
Figure 16H:
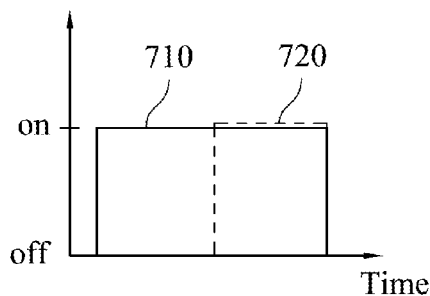
Figure 16I:
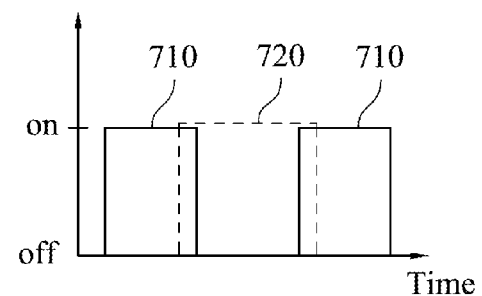

In some embodiments, the time period 710 of irradiating the electromagnetic wave 701 and the time period 720 of irradiating the electromagnetic wave 700 at least partially overlap, for example, as shown in FIG. 16D to FIG. 16I. The irradiation of the electromagnetic waves 700 and 701 may start simultaneously, for example, as shown in FIG. 16D and FIG. 16E. The irradiation of the electromagnetic waves 700 and 701 may start at different times, for example, as shown in FIG. 16F to FIG. 16I. The time period 710 of irradiating the electromagnetic wave 701 and the time period 720 of irradiating the electromagnetic wave 700 may completely overlap, for example, as shown in FIG. 16D. The time period 710 of irradiating the electromagnetic wave 701 and the time period 720 of irradiating the electromagnetic wave 700 may partially overlap, for example, as shown in FIG. 16E, FIG. 16F, FIG. 16G, FIG. 16H, and FIG. 16I. The electromagnetic wave 701 may irradiate first, for example, as shown in FIG. 16F. The electromagnetic wave 700 may irradiate first, for example, as shown in FIG. 16G. The electromagnetic waves 700 and 701 may alternately irradiate, for example, as shown in FIG. 16I. The irradiation of the electromagnetic waves 700 and 701 may end simultaneously, for example, as shown in FIG. 16D and FIG. 16H. The irradiation of the electromagnetic waves 700 and 701 may end at different times, for example, as shown in FIG. 16A to FIG. 16C, FIG. 16E, FIG. 16F, FIG. 16G, and FIG. 16I. The electromagnetic waves 700 may irradiate once or more than once. The electromagnetic waves 701 may irradiate once or more than once. The number of irradiating the electromagnetic wave 700 and the number of irradiating the electromagnetic wave 701 may be the same or different.

Because of the adhesion pressure and the buffer function of the adhesive layer 120, the location of each of the semiconductor structures 400 temporarily adhered to the adhesive layer 120 is remained in a predictable position during processes, such that the transfer head 200 can be positioned easily over the semiconductor structures 400. In addition, the impact forces of the transfer head 200 on the semiconductor structures 400 during the contacting are absorbed by the adhesive layer 120, such that the semiconductor structures 400 are not damaged by the transfer head 200. Therefore, the process yield is increased.

In addition, because the adhesive layer 120 includes the surfactant component, the adhesion pressure of the adhesive layer 120 to each of the semiconductor structures 400 can be further reduced after the electromagnetic waves 700 and/or the electromagnetic wave 701 are irradiated to the adhesive layer 120. Therefore, the semiconductor structures 400 are easier to be picked up with the transfer head 200 from the adhesive layer 120.

Further, since the adhesive layer 120 can be irradiated from both sides of the adhesive layer 120 by the electromagnetic wave 700 and/or the electromagnetic wave 701, the electromagnetic wave 700 and/or the electromagnetic wave 701 can be chosen to irradiate the adhesive layer 120 according to the characteristics of the carrier substrate 110, the adhesive layer 120, the semiconductor structure 400, the bottom electrode 410, and the manufacturing apparatus.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A method for transferring at least one semiconductor structure, the method comprising:
   coating an adhesive layer onto a carrier substrate;
   disposing the semiconductor structure onto the adhesive layer, such that the adhesive layer temporarily adheres the semiconductor structure thereto, wherein the adhesive layer comprises at least one adhesive component and at least one surfactant component at least after the disposing, the semiconductor structure comprises a body and a bottom electrode, and the bottom electrode is disposed between the body and the adhesive layer after the disposing;
   irradiating at least one first electromagnetic wave through at least one of the carrier substrate and the semiconductor structure to the adhesive layer to reduce adhesion pressure of the adhesive layer to the semiconductor structure while the semiconductor structure remains within a predictable position on the adhesive layer, wherein at least one of the carrier substrate and a combination of the body and the bottom electrode has a pass band in between ultraviolet to infrared; and transferring the semiconductor structure from the adhesive layer to a receiving substrate after the adhesion pressure of the adhesive layer is reduced.

2. The method of claim 1, wherein the pass band of the bottom electrode, the pass band of the body, and a spectrum of the first electromagnetic wave at least partially overlap.

3. The method of claim 2, further comprising:
irradiating at least one second electromagnetic wave to the adhesive layer to reduce the adhesion pressure of the adhesive layer to the semiconductor structure while the semiconductor structure remains within the predictable position on the adhesive layer, wherein the pass band of the carrier substrate and a spectrum of the second electromagnetic wave at least partially overlap.

4. The method of claim 3, wherein a time period of irradiating the first electromagnetic wave and a time period of irradiating the second electromagnetic wave do not overlap.

5. The method of claim 3, wherein a time period of irradiating the first electromagnetic wave and a time period of irradiating the second electromagnetic wave at least partially overlap.

6. The method of claim 1, wherein the pass band of the carrier substrate and a spectrum of the first electromagnetic wave at least partially overlap.

7. The method of claim 1, further comprising:
mixing the surfactant component with the adhesive component before the coating.

8. The method of claim 1, further comprising:
disposing the surfactant component onto a bottom surface of the semiconductor structure before the semiconductor structure is disposed onto the adhesive layer, wherein the bottom surface of the semiconductor structure is in contact with the adhesive layer after the semiconductor structure is disposed onto the adhesive layer.

9. The method of claim 1, further comprising:
disposing the surfactant component onto a top surface of the adhesive layer before the semiconductor structure is disposed onto the adhesive layer, wherein the top surface of the adhesive layer is in contact with the semiconductor structure after the semiconductor structure is disposed onto the adhesive layer.

10. The method of claim 1, wherein the surfactant component comprises at least one fluorosurfactant component, at least one silicone surfactant component, at least one hydrocarbon surfactant component, or any combination thereof.

11. The method of claim 1, wherein the surfactant component comprises at least one fluorosurfactant component, at least one silicone surfactant component, or any combination thereof.

12. The method of claim 1, wherein the surfactant component comprises at least one fluorosurfactant component.

13. The method of claim 1, wherein the first electromagnetic wave to the adhesive layer drives the surfactant component toward a top surface of the adhesive layer facing the semiconductor structure.

14. The method of claim 1, wherein the pass band of the carrier substrate is in a range between about 150 nm to about 1800 nm.

15. The method of claim 1, wherein the pass band of the bottom electrode is in a range between about 150 nm to about 1800 nm.

16. The method of claim 1, wherein the pass band of the body is in a range between about 150 nm to about 1800 nm.

17. The method of claim 1, wherein the first electromagnetic wave has a spectrum in a range between about 150 nm to about 1800 nm.

18. The method of claim 1, wherein the reduced adhesion pressure of the adhesive layer to the semiconductor structure is smaller than the adhesion pressure of the adhesive layer to the carrier substrate.

19. The method of claim 1, wherein the first electromagnetic wave is irradiated from one side of the adhesive layer opposite to the carrier substrate.

20. The method of claim 1, wherein the first electromagnetic wave is irradiated from one side of the adhesive layer facing the carrier substrate.

* * * * *